(12) United States Patent
Sung

(10) Patent No.: US 8,183,086 B2
(45) Date of Patent: May 22, 2012

(54) DIAMOND GAN DEVICES AND ASSOCIATED METHODS

(76) Inventor: Chien-Min Sung, Tansui (TW)

( * ) Notice: Subject to any disclaimer, the term of this patent is extended or adjusted under 35 U.S.C. 154(b) by 0 days.

(21) Appl. No.: 12/774,089

(22) Filed: May 5, 2010

(65) Prior Publication Data

US 2010/0314627 A1 Dec. 16, 2010

Related U.S. Application Data

(60) Provisional application No. 61/187,557, filed on Jun. 16, 2009.

(51) Int. Cl.
*H01L 21/00* (2006.01)
*H01L 21/20* (2006.01)
*H01L 29/15* (2006.01)
*H01L 23/12* (2006.01)

(52) U.S. Cl. ......... 438/105; 438/125; 438/479; 257/77; 257/701

(58) Field of Classification Search ............... None
See application file for complete search history.

(56) References Cited

U.S. PATENT DOCUMENTS

| | | | | |
|---|---|---|---|---|
| 5,373,171 A | * | 12/1994 | Imai et al. | 257/77 |
| 5,565,724 A | * | 10/1996 | Hachigo et al. | 310/313 A |
| 5,571,603 A | * | 11/1996 | Utumi et al. | 428/212 |
| 6,320,296 B1 | * | 11/2001 | Fujii et al. | 310/313 A |
| 6,448,688 B2 | * | 9/2002 | Fujii et al. | 310/313 A |
| 7,132,309 B2 | * | 11/2006 | Sung | 438/105 |
| 2004/0057482 A1 | * | 3/2004 | Wang | 372/45 |
| 2006/0211222 A1 | * | 9/2006 | Linares | 438/480 |
| 2007/0228873 A1 | * | 10/2007 | Lin et al. | 310/313 R |
| 2009/0078943 A1 | * | 3/2009 | Ishida et al. | 257/77 |

OTHER PUBLICATIONS

Taniyasu et al., MOVPE growth of single-crystal hexagonal AlN on cubic diamond, Journal of Crystal Growth (2009), pp. 1-6, Elsevier B.V., Kanagawa, Japan.

Miskys et al., AlN/diamond heterojunctions diodes, Applied Physics Letters, Jan. 13, 2003, p. 290-292, vol. 82, No. 2, American Institute of Physics.

* cited by examiner

*Primary Examiner* — Scott B Geyer
(74) *Attorney, Agent, or Firm* — Thorpe North & Western LLP

(57) ABSTRACT

Semiconductor devices and methods of making thereof are provided. In one aspect, for example, a method for making a semiconductor device can include polishing a working surface of a diamond layer to a substantially flat surface, depositing a buffer layer on the working surface of the diamond layer, and depositing a semiconductor layer on the buffer layer. In one specific aspect, the c-axis of the buffer layer is oriented perpendicular to the working surface of the diamond layer.

18 Claims, 1 Drawing Sheet

DIAMOND GAN DEVICES AND ASSOCIATED METHODS

PRIORITY DATA

This application claims the benefit of U.S. Provisional Patent Application Ser. No. 61/187,557, filed Jun. 16, 2009, which is incorporated herein by reference.

FIELD OF THE INVENTION

The present invention relates generally to semiconductor devices and associated methods. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with such electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

Various cooling devices have been employed such as fans, heat sinks, Peltier and liquid cooling devices, etc., as means of reducing heat buildup in electronic devices. As increased speed and power consumption cause increasing heat buildup, such cooling devices generally must increase in size to be effective and may also require power to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

As a result, methods and associated devices are being sought to provide adequate cooling of electronic devices while minimizing size and power constraints placed on such devices due to cooling.

SUMMARY OF THE INVENTION

Accordingly, the present invention provides semiconductor devices and methods of making thereof. In one aspect, for example, a method for making a semiconductor device can include polishing a working surface of a diamond layer to a substantially flat surface, depositing a buffer layer on the working surface of the diamond layer, and depositing a semiconductor layer on the buffer layer. In one specific aspect, the c-axis of the buffer layer is oriented perpendicular to the working surface of the diamond layer.

Numerous buffer layers are contemplated, and should include any buffer layer that facilitates improved lattice matching between the diamond layer and the semiconductor layer. In one aspect, for example, the buffer layer can be a carbide, an oxide, a nitride, or combinations thereof, where the buffer layer is domain matched with the diamond layer. Non-limiting examples of buffer layer materials can include TiC, ZrC, graphene, (B,Al)N, TiN, TaN, ZnO, NiO, and combinations thereof. Additionally, while numerous semiconductor materials are contemplated that can be utilized in the semiconductor layer, non-limiting examples can include GaN, (B,Al)N, AlN, and combinations thereof.

In another aspect of the present invention, a method of making a semiconductor device can include depositing a graphene layer on the working surface of a substrate, applying pressure and heat to the graphene layer to facilitate alignment of the graphene layer with at least 50% of substrate atoms, and depositing a GaN layer on the graphene layer. In another aspect, the substrate can be a diamond layer, and depositing the graphene layer on the working surface of the diamond layer can include polishing a working surface of the diamond layer to a substantially flat surface, and applying pressure and heat to the graphene layer to reorganize at least a portion of the diamond layer into a substantially single crystal diamond lattice at the graphene layer interface. Other non-limiting examples of substrates can include metals, glass, ceramics, single crystal silicon, polysilicon, semiconductor, and combinations thereof.

In another aspect of the present invention, a method for making a semiconductor device can include polishing a working surface of a diamond layer to a substantially flat surface, depositing a buffer layer on the working surface of the diamond layer, depositing a GaN material on the buffer layer to form a plurality of GaN islands, and growing the plurality of GaN islands in directions parallel to and perpendicular to the buffer layer to form a GaN layer. The GaN islands can be of various sizes prior to the growing step, depending on the specific techniques and materials used to form the islands. In one aspect, for example, the GaN islands are each less than about 100 nanometers in diameter prior to growing. In another aspect, the GaN islands are each from about 10 nanometers to about 50 nanometers in diameter prior to growing.

In yet another aspect of the present invention, a method for making a semiconductor device can include polishing a working surface of a diamond layer to a substantially flat surface, depositing a GaN material on the working surface of the diamond layer to form a plurality of GaN islands, and growing the plurality of GaN islands in directions parallel to and perpendicular to the working surface of the diamond layer to form a GaN layer.

In a further aspect of the present invention, a method for making a cubic-lattice semiconductor device can include polishing a working surface of a diamond layer to a substantially flat surface, depositing a buffer layer on the working surface of the diamond layer, and depositing a GaN material on the buffer layer such that the buffer layer orients the GaN material into a cubic GaN layer. Although a variety of buffer materials are contemplated, non-limiting examples can include a carbide or a nitride of a member selected from Ti, Zu, Hf, V, Nb, Ta, and combinations thereof. In one specific aspect the buffer layer is TiN.

In yet a further aspect of the present invention, a diamond semiconductor device is provide, including a p-type doped diamond layer having a polished working surface, a buffer layer disposed on the polished working surface of the diamond layer, and a substantially single crystal n-type doped semiconductor layer disposed on the buffer layer. Numerous semiconductor layers are contemplated, non-limiting examples of which include GaN, (B, Al)N, AlN and combinations thereof. In one specific aspect the semiconductor layer is a GaN layer having a cubic lattice orientation.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
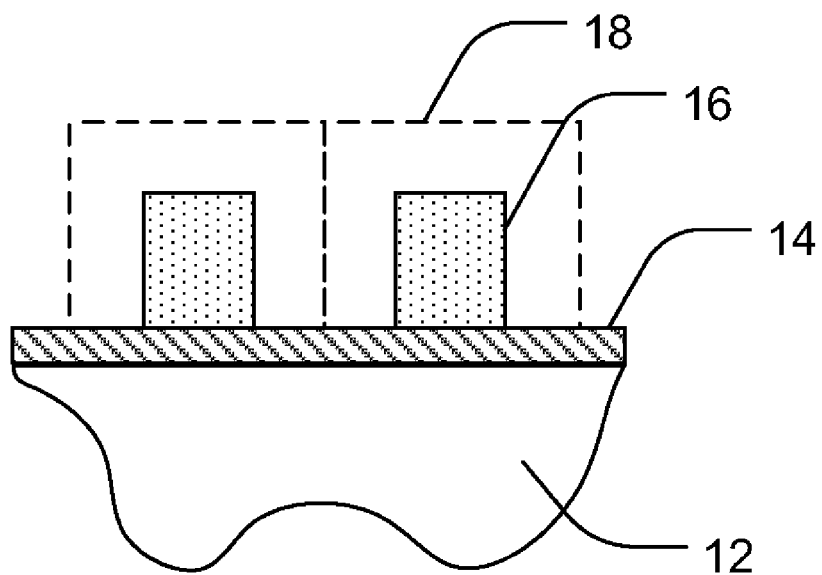
FIG. 1 is a cross-section view of a semiconductor device in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a dopant" includes reference to one or more of such dopants, and reference to "the diamond layer" includes reference to one or more of such layers.

As used herein, "vapor deposited" refers to materials which are formed using vapor deposition techniques. "Vapor deposition" refers to a process of forming or depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically forming or depositing diamond particles in a vapor form upon a surface. Various CVD techniques are well known in the art.

As used herein, "physical vapor deposition," or "PVD" refers to any method of physically forming or depositing diamond particles in a vapor form upon a surface. Various PVD techniques are well known in the art.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, the term "emitting" refers to the process of moving heat or light from a solid material into the air.

As used herein, "light-emitting surface" refers to a surface of a device or object from which light is intentionally emitted. Light may include visible light and light within the ultraviolet spectrum. An example of a light-emitting surface may include, without limitation, a nitride layer of an LED, or of semiconductor layers to be incorporated into an LED, from which light is emitted.

As used herein, the term "domain matched" is used to refer to chemical bonding on a portion of atoms across the interface or substrate in distributions of either clusters of full bonding in discrete areas, or bonding across large areas to all of the area of the substrate of every other atom or every few atoms.

As is used herein, the terms "flat" and "flatness" are used to refer to the flatness of a substrate in both the global and local sense. Global flatness is defined as the amount of bowing that occurs across the substrate. Local flatness refers to the roughness of the substrate, usually referred to as RA. Thus, "RA" refers to a measure of the roughness of a surface as determined by the difference in height between a peak and a neighboring valley.

As used herein, "substrate" refers to a support surface to which various materials can be joined in forming a semiconductor or semiconductor-on-diamond device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides semiconductor devices having incorporated conductive diamond layers and methods of making such devices. It should be noted that, even though much of the following description is devoted to light emitting devices such as LEDs, the scope of the claims of the present invention should not be limited thereby and that such teachings are equally applicable to other types of semiconductor devices.

Semiconductor devices are often challenging to cool, particularly those that emit light. Much of the heat generated by semiconductor devices tends to build up within the semiconducting layers, thus affecting the efficiency of the device. For example, an LED may consist of a plurality of nitride layers arranged to emit light from a light-emitting surface. As they have become increasingly important in electronics and lighting devices, LEDs continue to be developed that have ever increasing power requirements. This trend of increasing power has created cooling problems for such devices. These cooling problems can be exacerbated by the typically small size of these devices, which may render heat sinks with traditional aluminum heat fins ineffective due to their bulky nature. Additionally, such traditional heat sinks block the emission of light if applied to the light-emitting surface of the LED. Because heat sinks should not interfere with the function of the nitride layers or the light-emitting surface, they are often located at the junction between the LED and a supporting structure such as a circuit board. Such a heat sink location is relatively remote from the accumulation of much of the heat, namely, the light-emitting surface and the nitride layers.

Forming a diamond layer within the LED package allows adequate cooling even at high power, while at the same time maintaining a small LED package size. Additionally, in both semiconductor devices that emit light and those that don't, heat may be trapped within the semiconducting layers due to the relatively poor thermal conductivity of materials that often make up these layers. Additionally, crystal lattice mismatches between semiconductive layers and the diamond layer slow the conduction of heat, thus facilitating further heat buildup.

The devices and methods of the present invention utilize novel techniques for forming substantially single crystal semiconductor materials on a substrate. In some aspects, the substrate is a diamond layer, and improved lattice matching between the semiconductor and the diamond layer can greatly improve the thermal cooling properties of the device. Additionally, it should be noted that the beneficial properties provided by diamond layers may extend beyond cooling, and as such, the present scope should not be limited thereto.

In one aspect of the present invention, a semiconductor layer such as GaN can be grown on a diamond substrate to a substantially single crystal lattice configuration. GaN normally has a wurtzitic structure that is hexagonal with plate morphology. Due to a large lattice mismatch with diamond, GaN cannot be bonded to diamond across the entire surface because distortions due to thermal expansion mismatch can be unmanageable. However, because of its plate morphology, GaN can be aligned along a flat surface, such as a polished substrate. The flat, polished surface can be used to anchor GaN along its basal planes so that the c-axis of the GaN material is perpendicular to the substrate. In other words, the GaN can be matched in discrete domains along the flat surface of the substrate, and once this has occurred, the domains can be joined into a continuous lattice that can be relatively stress free. Thus such domain matching can cause a polycrystalline substrate such as polycrystalline diamond to be healed to a single crystal as the overlying domain matched layers grow. This can be accomplished by seeding the diamond substrate with the semiconductor in such a way that the seeds all have a lattice oriented in the same direction. The seeds can then be grown laterally in a direction parallel to the plane of the diamond substrate, and in a direction that is perpendicular to the plane of the diamond substrate. Thus the gaps between the seeds eventually become filled with a continuous layer of semiconductor material. As the semiconductor layer grows, grain boundaries that may exist are greatly reduced or eliminated to form a substantially single crystal semiconductor layer. In some cases, thermal cycling can additionally be used to facilitate this process.

While the GaN material or other semiconductor can be deposited in discrete domains on a flat substrate, in some aspects, a buffer layer can be utilized to orient the semiconductor seeds in a uniform direction. A buffer layer oriented with a single crystal lattice orientation with respect to the deposition surface of the substrate can function to orient the semiconductor seeds in a uniform direction. Once the seeds are uniformly oriented, subsequent semiconductor growth occurs at the same crystallographic orientation in both the lateral (i.e. parallel to the buffer layer) and upward (i.e. perpendicular to the buffer layer) directions. FIG. 1 shows a diamond layer 12 having a buffer layer 14 upon which GaN seeds 16 have been deposited. The dashed outline 18 describes the growth of the GaN layer as deposition continues. These "islands" of semiconductor material thus grows and eventually fuses into one substantially single crystal layer. The size of the GaN islands can vary depending on a variety of factors. In one aspect, however, the GaN islands are each less than about 100 nanometers in diameter prior to growing. In another aspect, the GaN islands are each from about 10 nanometers to about 50 nanometers in diameter prior to growing. The spacing between the islands can additionally vary, however in some aspects the space can equal approximately the size of the islands. So for example, if the islands were 30 nm in diameter, there would be a 30 nm space in between each island. Additionally, as has been described, the GaN material can be aligned along a c-axis orientation perpendicular to the working surface of the diamond layer. As such, Ga from the GaN material can align along the A-B axis.

It should be noted that crystal dislocations that have been introduced into the crystal lattice are gradually eliminated as the semiconductor grows in the perpendicular direction. In some aspects, thermal cycling can additionally be used to more quickly eliminate such dislocations.

The resulting semiconductor devices have substantially single crystal semiconductor layers that are epitaxially linked to the underlying substrate. In those cases where the underlying substrate is diamond, heat transfer properties are improved due to the close match between the diamond lattice and the semiconductor lattice. These high quality semiconductors can be utilized in a variety of devices, including LEDs, laser diodes, p-n junction devices, p-i-n junction devices, SAW and BAW filters, and the like.

Figure 2:
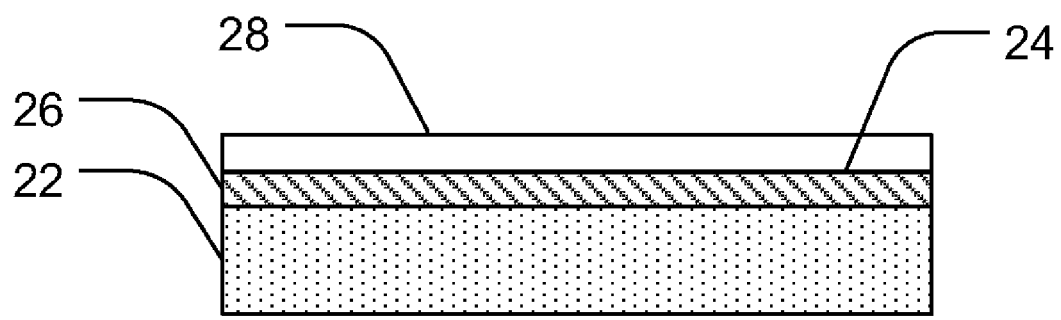
FIG. 2 is a cross-section view of a semiconductor device in accordance with one embodiment of the present invention.

FIG. 2 shows a semiconductor device having a diamond layer 22 having a polished surface 24. A buffer layer 26 is deposited on the polished surface 24 of the diamond layer 22, and a substantially single crystal semiconductor layer 28 is deposited on the buffer layer 26. Numerous types of diamond materials are contemplated. Non-limiting examples include natural and synthetic diamond materials, polycrystalline diamond, single crystal diamond, and the like. In one aspect, the diamond material can be a polycrystalline diamond layer. It should be noted that any type of diamond layer can be utilized provided the layer is properly polished to provide a substantially flat surface for deposition of the semiconductor and/or buffer layer. Various methods of polishing a diamond layer are contemplated depending on the methods for growth and the orientation of the diamond layer with respect to the polishing device. For example, a diamond layer can be formed and polished on the growth surface or it can be formed and polished on seed surface once the seed mold has been removed. In one aspect, the diamond layer is polished on the growth surface. This may be preferred as opposed to polishing from the seed surface in some aspects because many of the dislocations that arise at the seed surface have been repaired during the growth process. Additionally, the thickness of the diamond layer can influence the amount of time and effort required to polish. Thus in some aspects, it can be beneficial to utilize a diamond layer that is no thicker than necessary for the application. In one aspect, for example, the diamond layer can be less than 50 microns thick. In another aspect, the diamond layer can be 20 microns thick or less. In yet another aspect, the diamond layer can be from about 1 micron to about 30 microns thick. In a further aspect, the diamond layer can be from about 5 microns to about 30 microns thick. In yet a further aspect, the diamond layer can be less than about 1 micron thick.

Numerous buffer layer materials can be utilized in the techniques described herein. In one aspect, for example, the buffer layer can be a carbide, a nitride, an oxide, or a combination thereof, provided the buffer layer material is capable of domain matching with the diamond layer. Accordingly, any carbide, nitride, or oxide fitting this criterion can be used, including non-limiting examples such as TiC, ZrC, graphene, AlN, (B,Al)N, TiN, TaN, ZnO, NiO, and combinations thereof. Additionally, the buffer layer can be deposited in any known lattice configuration that is possible for that buffer material and carbide or nitride forming elements, such as Ti, can be added in either stoichiometric or non-stoichiometric amounts. For example, buffer layers can be deposited as wurtzitic, hexagonal, cubic, amorphous, or combinations thereof.

As has been described, the buffer layer and/or the semiconductor layer are deposited on a substantially flat surface. Flatness can be global flatness or local flatness. Global flatness is the amount of bowing that occurs across the surface of the layer. While global flatness is less of an impact on the deposition of a semiconductor material, such bowing can affect the overall product and the manufacturing process, so in many cases it should be minimized. In one aspect, for example, such bowing should be less than about 2 microns across 2 inches of distance along the substrate in either convexity or concavity. A more important flatness measurement for the present applications is the local flatness of the substrate. Such local flatness, or smoothness is referred to as RA, and is defined more specifically herein. In one aspect, the RA of the substrate should be less than or equal to about 15 nm. In another aspect, the RA of the substrate should be between about 1 nm and about 10 nm. Additionally, various methods of polishing a substrate such as diamond are well known in the art, and any such method of polishing should be considered to be within the present scope. One non-limiting example of such a process is CMP processing. In aspects of the present invention, a diamond layer is deposited on a silicon or other substrate. Such a substrate can additionally assist in holding and positioning the diamond layer during polishing.

Diamond materials have excellent thermal conductivity properties that make them ideal for incorporation into semiconductor devices as has been described herein. The transfer of heat that is present in the semiconductor device can thus be accelerated from the device through a diamond material. It should be noted that the present invention is not limited as to specific theories of heat transmission. As such, in one aspect the accelerated movement of heat from inside the device can be at least partially due to heat movement into and through a diamond layer. Due to the heat conductive properties of diamond, heat can rapidly spread laterally through the diamond layer and to the edges of a semiconductor device. Heat present around the edges will be more rapidly dissipated into the air or into surrounding structures, such as heat spreaders or device supports. Additionally, diamond layers having a portion of surface area exposed to air will more rapidly dissipate heat from a device in which such a layer is incorporated. Because the thermal conductivity of diamond is greater than the thermal conductivity of a semiconductor layer or other structure to which it is thermally coupled, a heat sink is established by the diamond layer. Thus heat that builds up in the semiconductor layer is drawn into the diamond layer and spread laterally to be discharged from the device. Such accelerated heat transfer may result in semiconductor devices with much cooler operational temperatures. Additionally, the acceleration of heat transfer not only cools a semiconductor device, but may also reduce the heat load on many electronic components that are spatially located nearby the semiconductor device.

It should be understood that the following is a very general discussion of diamond deposition techniques that may or may not apply to a particular layer or application, and that such techniques may vary widely between the various aspects of the present invention. Generally, diamond layers may be formed by any means known, including various vapor deposition techniques. Any number of known vapor deposition techniques may be used to form these diamond layers. The most common vapor deposition techniques include chemical vapor deposition (CVD) and physical vapor deposition (PVD), although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for semiconductor layers, are well known to those skilled in the art. In another aspect, PVD techniques such as sputtering, cathodic arc, and thermal evaporation may be utilized. Additionally, molecular beam epitaxy (MBE), atomic layer deposition (ALD), and the like can additionally be used. Further, specific deposition conditions may be used in order to adjust the exact type of material to be deposited, whether DLC, amorphous diamond, or pure diamond.

An optional nucleation enhancing layer can be formed on the growth surface of a substrate in order to improve the quality and deposition time of a diamond layer. As has been described, the diamond layer can be deposited on a variety of suitable materials, including, for example, a silicon wafer or mold. Specifically, a diamond layer can be formed by depositing applicable nuclei, such as diamond nuclei, on a diamond growth surface of a substrate and then growing the nuclei into a film or layer using a vapor deposition technique. In one aspect of the present invention, a thin nucleation enhancer layer can be coated upon the substrate to enhance the growth of the diamond layer. Diamond nuclei are then placed upon the nucleation enhancer layer, and the growth of the diamond layer proceeds via CVD.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials may include, without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the thermal transmission properties of the diamond layer. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the growth surface of the substrate or the nucleation enhancer layer may be increased in order to reduce the amount of interstitial space between diamond particles. Examples of ways to increase nucleation rates include, but are not limited to; applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 200° C. such as about 150° C. Other methods of increasing diamond nucleation will be readily apparent to those skilled in the art.

In one aspect of the present invention, the diamond layer may be formed as a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions that are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form a conformal diamond layer. The diamond growth conditions may be those conditions which are commonly used in traditional CVD diamond growth. However, unlike conventional diamond film growth, the diamond film produced using the above pretreatment steps results in a conformal diamond film that typically begins growth substantially over the entire growth surface with substantially no incubation time. In addition, a continuous film, e.g. substantially no grain boundaries, can develop within about 80 nm of growth.

Diamond layers having substantially no grain boundaries may move heat more efficiently than those layers having grain boundaries.

The diamond layers according to aspects of the present invention may be of any thickness that would allow thermal cooling of a semiconductor device. Thicknesses may vary depending on the application and the semiconductor device configuration. For example, greater cooling requirements may require thicker diamond layers. The thickness may also vary depending on the material used in the diamond layer. That being said, in one aspect a diamond layer may be from about 10 to about 50 microns thick. In another example, a diamond layer may be less than or equal to about 10 microns thick. In yet another example, a diamond layer may be from about 50 microns to about 100 microns thick. In a further example, a diamond layer may be greater than about 50 microns thick.

Additionally, in some aspects the diamond layer can be a conductive diamond layer. Various techniques may be employed to render a diamond layer conductive. Such techniques are known to those of ordinary skill in the art. For example, various impurities may be doped into the crystal lattice of the diamond layer. Such impurities may include elements such as Si, B, P, N, Li, Al, Ga, etc. In one specific aspect, for example, the diamond layer may be doped with B to form a p-type conductive diamond layer. Impurities may also include metallic particles within the crystal lattice, provided they do not interfere with the function of the device, such as by blocking light emitted from an LED. In one specific aspect, the diamond layer can be doped with boron to produce a p-type semiconductor material.

Various semiconductor materials are contemplated that can be used in the devices of the present invention. The semiconductor layer may include any material that is suitable for forming electronic devices, semiconductor devices, or the like. Many semiconductors are based on silicon, gallium, indium, and germanium. However, suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one aspect, however, the semiconductor layer can include silicon, silicon carbide, gallium arsenide, gallium nitride, gallium phosphide, aluminum nitride, indium nitride, indium gallium nitride, aluminum gallium nitride, or composites of these materials.

In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, $c-Y_2O_3$, $c-(Y_{0.9}La_{0.1})_2O_3$, $c-Al_{23}O_{27}N_5$, $c-MgAl_2O_4$, $t-MgF_2$, graphite, and mixtures thereof. In one specific aspect, the semiconductor material can be GaN. In another specific aspect, the semiconductor material can be (B,Al)N or AlN. It should be noted that the semiconductor material can be doped as is well known in the art. In one specific aspect, GaN can be doped with silicon to form an n-type semiconductor material.

Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As has been described, the semiconductor layer 14 may be formed by any method known to one of ordinary skill in the art. Various known methods of vapor deposition can be utilized to deposit such layers and that allow deposition to occur in a graded manner. Additionally, surface processing may be performed between any of the deposition steps described in order to provide a smooth surface for subsequent deposition. Such processing may be accomplished by any means known, such as by chemical etching, polishing, buffing, grinding, etc.

The present invention additionally provides methods making cubic GaN layers and associated devices. GaN is normally deposited on a substrate in wurtzitic form. Such a form is piezoelectric, and while useful for some applications, can be a hindrance for others. For example, as electricity flows through a wurtzitic GaN LED, the GaN lattice will move relative to the amount of electricity flowing though the layer. This movement causes internal stress, which ultimately limits the amount luminosity that the LED can produce. Because cubic GaN does not exhibit piezoelectric properties, these problems are eliminated.

In one aspect, for example, a method for making a cubic-lattice semiconductor device can include polishing a working surface of a diamond layer to a substantially flat surface, depositing a buffer layer on the working surface of the diamond layer, and depositing a GaN material on the buffer layer such that the buffer layer orients the GaN material into a cubic GaN layer. As has been described herein, a buffer layer can cause deposited GaN seeds to orient in a uniform direction. As such, a buffer layer having a cubic orientation can force the GaN seeds to be deposited in a cubic orientation. Thus, because the seeds are in a cubic orientation, the GaN material growth therefrom will be cubic.

A variety of materials can be utilized to form buffer layers that allow the formation of cubic GaN. Non-limiting examples include carbide or nitride members of Ti, Zu, Hf, V, Nb, Ta, and combinations thereof. Such elements can be added in either stoichiometric or non-stoichiometric amounts. One useful buffer layer, for example, is TiN. GaN deposited on a layer of TiN will deposit and grow as a cubic GaN layer.

In another aspect of the present invention, a graphene layer can be utilized as a buffer layer to orient a semiconductor layer deposited thereon. A graphene layer can be deposited onto a substrate and heat pressed to cause alignment with the substrate lattice. For example, if the substrate is a diamond layer, the graphene layer and the diamond layer will align every two or three carbon atoms of the graphene layer. This can be particularly useful for diamond layers that are not single crystal. By aligning with the graphene layer as has been described, a polycrystalline diamond layer is effectively converted into a single crystal lattice upon which a semiconductor such as GaN can be deposited. This alignment not only reduces thermal stress within the semiconductor, but it also improves heat transfer.

Accordingly, in one aspect, a method of making a semiconductor device is provided. Such a method can include depositing a graphene layer on the working surface of a substrate, applying pressure and heat to the graphene layer to facilitate alignment of the graphene layer with at least 50% of substrate atoms, and depositing a GaN layer on the graphene layer. In another aspect, the substrate is a diamond layer and depositing the graphene layer on the working surface of the diamond layer includes polishing a working surface of the diamond layer to a substantially flat surface, and applying pressure and heat to the graphene layer to reorganize at least a portion of the diamond layer into a substantially single crystal diamond lattice at the graphene layer interface. In addition to diamond layers, suitable substrates include metals, glasses, ceramics, single crystal silicons, polysilicons, semiconductors, and combinations thereof.

In one further aspect, graphene can be utilized as a buffer layer between two non-diamond layers. For example, a graphene layer can be positioned between a silicon substrate and an indium nitride semiconductor layer. By annealing these materials under heat and pressure, a silicon wafer is formed with an epitaxial indium nitride layer attached thereto. This surface can then be utilized to grow a GaN layer. The resulting (In,Ga)N material will additionally be cubic.

EXAMPLES

The following examples illustrate various techniques of making semiconductor devices according to aspects of the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

Example 1

A polished silicon wafer of (100) orientation is sputtered with amorphous silicon of about 10 nm thick. The coating is etched by conventional lithography to expose nano islands (about 10 microns across) of original lattice. The wafer is then placed in a CVD system to grow diamond film.

Very low methane content (0.5% of $H_2$) is used to avoid spontaneous nucleation of diamond. A bias is applied to grow diamond on the lattice islands. Subsequently, methane content is raised to 1% for enhanced growth of a diamond film up to 10 micron thick. The result is a quasi single crystal of diamond film of (100) orientation. The diamond film is polished to achieve Ra of a few nanometers. Molecular beam epitaxy (MBE) is used to grow AlN at the interface. Subsequently, nanorods are formed with uniform spacing. The nanorods are finally covered with a continuous lattice of GaN.

Example 2

A CVD diamond layer is formed on a silicon wafer to a thickness of about 20 microns. The diamond layer is polished to a flatness of less than 2 microns per inch and an RA of less than one micron. The polished surface is sputtered to form an amorphous AlN layer of several nanometers. A MBE process is used to grow islands of GaN as in Example 1, with a uniform distribution and a similar crystal orientation. The GaN islands are grown under MBE to form a continuous GaN layer.

Example 3

A diamond film as described in Example 2 is sputtered with TiN. The TiN layer is graded to GaN by the method of TiN→AlN→Gan. Because of the similarity in crystal lattices between TiN and AlN, AlN is deposited on TiN as a cubic AlN layer. Similarly, the GaN layer deposited on the AlN layer is also oriented as a cubic layer.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a semiconductor device, comprising:
   polishing a working surface of a diamond layer to a substantially flat surface;
   depositing a buffer layer on the working surface of the diamond layer; and
   depositing a semiconductor layer on the buffer layer, wherein the buffer layer c-axis is oriented perpendicular to the working surface of the diamond layer.

2. The method of claim 1, wherein the buffer layer is a member selected from the group consisting of a carbide, an oxide, a nitride, and combinations thereof, and wherein the buffer layer is domain matched with the diamond layer.

3. The method of claim 1, wherein the substantially flat surface has an RA that is from about 1 nm to about 10 nm.

4. The method of claim 1, wherein the semiconductor layer is a member selected from the group consisting of GaN, (B,Al)N, AlN, and combinations thereof.

5. The method of claim 1, further comprising doping at least one of the diamond layer and the semiconductor layer.

6. The method of claim 1, wherein the diamond layer is a polycrystalline diamond layer.

7. A method of making a semiconductor device, comprising:
   polishing a working surface of a diamond layer to a substantially flat surface;
   depositing a buffer layer on the working surface of the diamond layer; and
   depositing a semiconductor layer on the buffer layer, wherein the buffer layer is a member selected from the group consisting of TiC, ZrC, graphene, AlN, (B,Al)N, TiN, TaN, ZnO, NiO, and combinations thereof.

8. A method of making a semiconductor device, comprising:
   depositing a graphene layer on the working surface of a substrate;
   applying pressure and heat to the graphene layer to facilitate alignment of the graphene layer with at least 50% of substrate atoms; and
   depositing a GaN layer on the graphene layer.

9. The method of claim 8, wherein the substrate is a diamond layer and depositing the graphene layer on the working surface of the diamond layer includes:
   polishing a working surface of the diamond layer to a substantially flat surface; and applying pressure and heat to the graphene layer to reorganize at least a portion of the diamond layer into a substantially single crystal diamond lattice at the graphene layer interface.

10. The method of claim 8, wherein the substrate is a member selected from the group consisting of metals, glasses, ceramics, single crystal silicons, polysilicons, semiconductors, and combinations thereof.

11. A method for making a semiconductor device, comprising;
polishing a working surface of a diamond layer to a substantially flat surface;
depositing a buffer layer on the working surface of the diamond layer;
depositing a GaN material on the buffer layer to form a plurality of GaN islands; and
growing the plurality of GaN islands in directions parallel to and perpendicular to the buffer layer to form a GaN layer, wherein the GaN islands are each less than about 100 nanometers in diameter prior to growing.

12. The method of claim 11, wherein the GaN islands are each from about 10 nanometers to about 50 nanometers in diameter prior to growing.

13. The method of claim 11, wherein N from the GaN material aligns along a c-axis orientation perpendicular to the working surface of the diamond layer, and Ga from the GaN material aligns along an A-B axis.

14. A method for making a semiconductor device, comprising;
polishing a working surface of a diamond layer to a substantially flat surface;
depositing a buffer layer on the working surface of the diamond layer;
depositing a GaN material on the buffer layer to form a plurality of GaN islands;
growing the plurality of GaN islands in directions parallel to and perpendicular to the buffer layer to form a GaN layer; and
heat treating the GaN layer to minimize crystal lattice dislocations.

15. A method for making a cubic-lattice semiconductor device, comprising:
polishing a working surface of a diamond layer to a substantially flat surface;
depositing a buffer layer on the working surface of the diamond layer; and
depositing a GaN material on the buffer layer such that the buffer layer orients the GaN material into a cubic GaN layer.

16. The method of claim 15, wherein the buffer layer is a carbide or a nitride of a member selected from the group consisting of Ti, Zu, Hf, V, Nb, Ta, and combinations thereof.

17. The method of claim 15, wherein the buffer layer is TiN.

18. A diamond semiconductor device, comprising:
a p-type doped diamond layer having a polished working surface;
a buffer layer disposed on the polished working surface of the diamond layer; and
an n-type doped semiconductor layer disposed on the buffer layer; wherein the semiconductor layer is a GaN layer having a cubic lattice orientation.

* * * * *